(12) United States Patent
Ko et al.

(10) Patent No.: US 8,023,553 B2
(45) Date of Patent: Sep. 20, 2011

(54) CIRCUITS FOR GENERATING DELAYED HIGH FREQUENCY CLOCK SIGNALS USED IN SPREAD-SPECTRUM CLOCKING

(75) Inventors: JaeHong Ko, Seoul (KR); SeungJung Lee, Seoul (KR); Taekyoung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1202 days.

(21) Appl. No.: 11/641,140

(22) Filed: Dec. 19, 2006

(65) Prior Publication Data
US 2007/0217481 A1 Sep. 20, 2007

(30) Foreign Application Priority Data
Mar. 20, 2006 (KR) .................. 10-2006-0025199

(51) Int. Cl.
*H04B 1/00* (2006.01)
(52) U.S. Cl. ............... 375/137; 375/130; 375/376
(58) Field of Classification Search ............. 375/137, 375/130, 376; 327/145, 148, 291
See application file for complete search history.

(56) References Cited

U.S. PATENT DOCUMENTS

| | | | | |
|---|---|---|---|---|
| 5,610,955 A * | 3/1997 | Bland | ............ | 375/376 |
| 6,167,103 A | 12/2000 | Hardin | | |
| 6,400,754 B2 * | 6/2002 | Fleming et al. | ............ | 375/140 |
| 6,580,432 B1 * | 6/2003 | Leung et al. | ............ | 345/558 |
| 6,643,317 B1 * | 11/2003 | Blumer | ............ | 375/130 |
| 7,061,286 B2 * | 6/2006 | Nakamura | ............ | 327/145 |
| 7,208,988 B2 * | 4/2007 | Murata et al. | ............ | 327/148 |
| 7,362,395 B2 * | 4/2008 | Kim et al. | ............ | 349/110 |
| 7,573,932 B2 * | 8/2009 | Kim et al. | ............ | 375/130 |
| 2004/0032899 A1 * | 2/2004 | Blumer | ............ | 375/130 |
| 2004/0076221 A1 * | 4/2004 | Refaeli et al. | ............ | 375/130 |
| 2004/0095988 A1 | 5/2004 | Kim et al. | | |

OTHER PUBLICATIONS

Sadamura et al. "Spread-Spectrum Clocking in Switching Regulators to Reduce EMI" 2002 IEEE Asia-Pacific Conference on ASIC, pp. 141-144 (2002).
Taiwanese Office Action issued on Apr. 12, 2010 in corresponding Taiwan Patent Application No. 096101245, p. 1-8.
S. Damphousse, K. Ouici, A. Rizki, M. Mallinson, "All Digital Spread Spectrum Clock Generator for EMI Reduction," IEEE ISSCC, pp. 962-971, Feb. 2006.
H. Sadamura, T. Daimon, T. Shindo, H. Kobayashi, T. Myono, T. Suzuki, S. Kawai, T. Iijima, "Spread-spectrum clocking in switching regulators to reduce EMI," IEEE Proc. Asia-Pacific Conference, pp. 141-144, 2002.

* cited by examiner

*Primary Examiner* — Shuwang Liu
*Assistant Examiner* — Helene Tayong
(74) *Attorney, Agent, or Firm* — Myers Bigel Sibley & Sajovec, P.A.

(57) ABSTRACT

A method of generating a spread-spectrum clock signal includes delaying a high frequency clock signal to provide a plurality of delayed high frequency clock signals selected among to provide a spread-spectrum clock signal for a synchronous system.

9 Claims, 8 Drawing Sheets

CIRCUITS FOR GENERATING DELAYED HIGH FREQUENCY CLOCK SIGNALS USED IN SPREAD-SPECTRUM CLOCKING

CROSS-REFERENCE TO RELATED APPLICATION

The present application claims priority to Korean Patent Application No. 2006-0025199, filed in the Korean Intellectual Property Office on Mar. 20, 2006, the disclosure of which is incorporated herein by reference.

FIELD OF THE INVENTION

The present invention relates generally to a field of electronics and, more particularly, to methods, circuits, and systems for spread-spectrum clocking.

BACKGROUND

Spread-spectrum clocking has been used to reduce Electro-Magnetic Interference (EMI) by "broad-banding" a normally narrow-band clock signal to spread the energy contained therein over a wider range of frequencies. Broad-banding the signal over a wider range of frequencies can reduce the EMI by spreading the frequency component of the clock signal so that, for example, the clock edges of the clock signal become offset from one another in time.

The generation of spread-spectrum clocks can be done using various approaches. Some approaches use a phase-lock loop (PLL) to produce a spread-spectrum output. One such PLL based approach is discussed in, for example, U.S. Pat. No. 6,167,103 to Hardin. In other approaches, a spread-spectrum clock can be provided using delay units. In this type of delay approach, a delay controller circuit can be used to modify a delay provided by an associated cell. A clock signal is provided to a first one of the cells to generate a first output which is then provided in turn to a second cell in the sequence. The output of a final cell can be used to provide the spread-spectrum output. This type of approach is discussed in, for example, U.S. Patent publication No. 2004-0095988.

In still another approach to spread-spectrum clocking, a pseudo random modulation technique is used to provide phase modulation (dithering) of a switching regulator control block to spread the noise-power spectrum in the frequency domain to reduce EMI. In such an approach, and N-bit M-sequence generator can be driven by a clock to produce a pseudo random signal. A shift register is also driven by the clock to delay a pulse width modulation controller output for the spread-spectrum clocking. On such dithering approach is discussed in, for example, *Spread-Spectrum Clocking in Switching Regulators to Reduce EMI*, by Sadamura et al., Dept. of Electronic Engineering, Gunma University, 1-5-1 Tenjin-cho Kiryu 376-8515 Japan.

SUMMARY

Embodiments according to the invention can provide methods, circuits, and systems for generating delayed high-frequency clock signals used in spread-spectrum clocking. Pursuant to these embodiments, a method of generating a spread-spectrum clock signal can include delaying a high frequency clock signal to provide a plurality of delayed high frequency clock signals selected among to provide a spread-spectrum clock signal for a synchronous system.

In some embodiments according to the invention, a method of generating a spread-spectrum clock signal includes delaying a high frequency clock signal to provide a plurality of delayed high frequency clocks for clocking a low frequency clock signal at a plurality of different times.

In some embodiments according to the invention, a spread-spectrum clock signal generator circuit includes a delay circuit configured to receive a clock signal and provide a plurality of delayed clock signals based thereon. A pseudo-random clock selection signal generator is configured to generate delayed clock selection signals responsive to the clock signal. A multiplexer circuit is coupled to the pseudo-random clock selection signal generator and the delay circuit and is configured to pseudo-randomly select among the plurality of delayed clock signals.

DESCRIPTION OF THE EMBODIMENTS ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described herein in greater detail, embodiments according to the invention can provide circuits, methods, and systems for the generation of spread-spectrum clocks by delaying a high-frequency clock signal to provide a plurality of delayed high-frequency clock signals, which are selected among to provide the spread-spectrum clock signal. In some embodiments according to the invention, a plurality of delayed high-frequency clock signals are provided by delaying the high-frequency clock signal which is used for the overall synchronous operation of the system. Delaying the high-frequency clock signal provides a plurality of delayed high-frequency clock signals which can be selected among to provide the spread-spectrum clock signal.

In some embodiments according to the invention, the plurality of delayed high-frequency clock signals are provided directly to a Multiplexer (MUX) circuit which is used to select among the plurality of high-frequency clock signals to provide the spread-spectrum clock signal. In particular, a selection circuit can change which of the delayed high-frequency clock signals is selected by the MUX to be the spread-spectrum clock signal. Moreover, the selection circuit can change the selection of the delayed high-frequency clock signal responsive to a number of cycles of the high-frequency clock signal used to generate the plurality of delayed high-frequency clock signals so that the selection circuit can select different edges from each of the plurality of delayed high-frequency clock signals to be used as the edges of the spread-spectrum clock signal.

In still other embodiments according to the invention, a delay circuit used to provide the plurality of high-frequency delayed clock signals can delay the high-frequency clock signal so that each of the plurality of delayed high-frequency clock signals is delayed for a different time interval so that the edges of the plurality of delayed high-frequency clock signals are offset from one another in time. Furthermore, a fine delay adjustment circuit can modify the time intervals provided by the delay circuit so that the timing of the edges included in the plurality of delayed high-frequency clock signals can be adjusted by relatively small amounts of time. In still other embodiments according to the invention, the fine delay adjustment circuit is used to adjust the time intervals provided to the plurality of delayed high-frequency clock signals in conjunction with operation of the selection circuit so that the MUX circuit selects among the plurality of delayed high frequency clock signals having the fine delay adjustments included therewith (i.e., a combination of both the fine delay adjustment and selection of which of the delayed high-frequency clock signals is to be used). Such a combination can effectively provide, for example, a pseudo-random sequence of M×N, where M is the period of the frequency of the high frequency clock signal and N is the frequency of the clock signal used to control the fine delay adjustment circuit.

In still other embodiments according to the invention, the delayed high-frequency clock signals are provided to the MUX through a clocked register circuit. And in still other embodiments according to the invention, the plurality of delayed high-frequency clock signals are provided from the delay circuit directly to the MUX (i.e., without an intervening clocked register circuit). In yet other embodiments according to the invention, a system clock is provided to the selection circuit for operation of the MUX to select among the plurality of delayed high-frequency clock signals and provided to the delay circuit as the high-frequency clock signal input to be delayed as well as to the delay adjustment circuit for adjustment of the time intervals provided to each of the delayed high-frequency clock signals. In such embodiments according to the invention, the clock signals provided to the delay circuit can be based on the system clock provided to the selection circuit and, moreover, can be divided so that the system clock operates at least twice the frequency of the clocks provided to the delay circuit.

Figure 1:
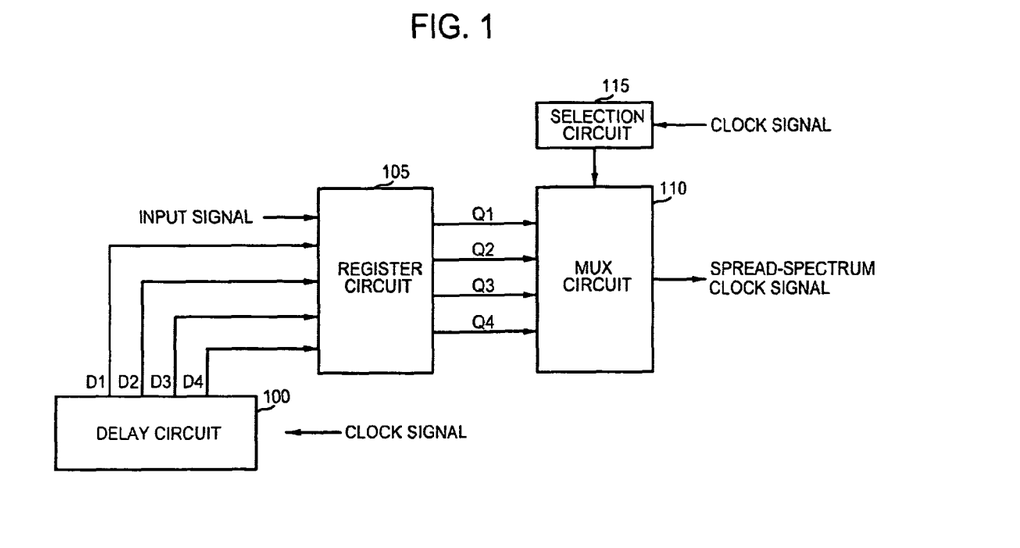
FIG. 1 is a block diagram that illustrates circuits and methods used to generate spread-spectrum clock signals using delay circuits according to some embodiments of the invention.

FIG. 1 is a block diagram that illustrates circuits and methods for generating a high-frequency spread-spectrum clock signal from a plurality of delayed high-frequency clock signals in some embodiments according to the invention. As shown in FIG. 1, a high-frequency clock signal is provided to a delay circuit 100 and to a selection circuit 115. The delay circuit 100 is configured to delay the high-frequency clock signal for a plurality of different time intervals to provide a plurality of delayed clock signals D1-D4. It will be understood that although only four outputs of the delayed circuit 100 are shown, additional or fewer outputs may be provided. Moreover, the other circuits shown herein may also employ fewer or more signals as shown.

Figure 2:
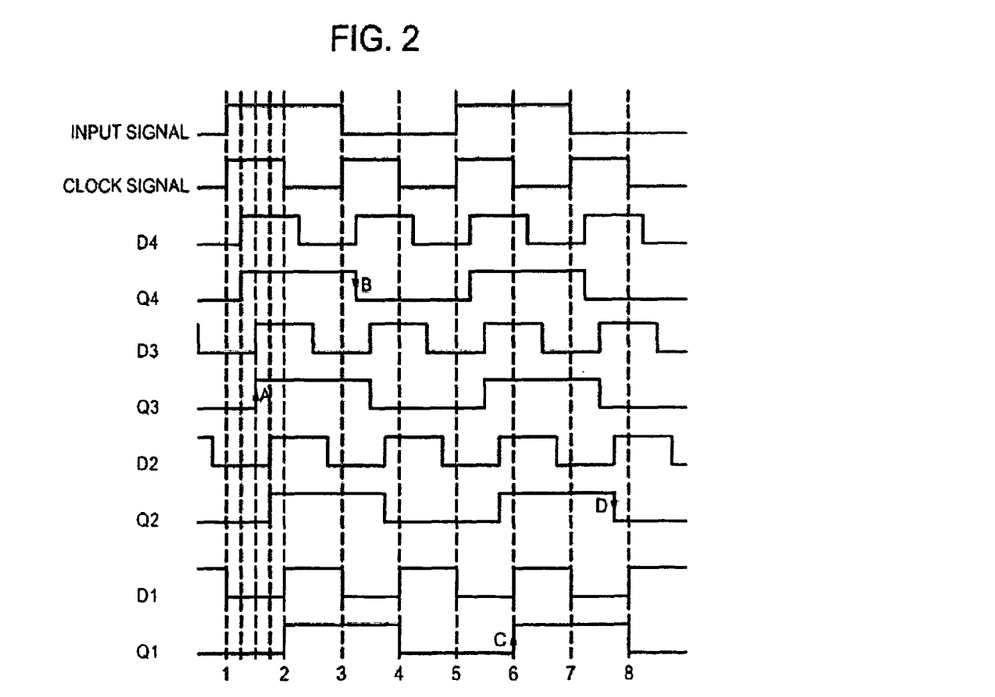
FIGS. 2 and 3 are timing diagrams that illustrate operations of circuits and methods used to generate spread-spectrum clock signals according to some embodiments of the invention.

In some embodiments according to the invention, the delay circuit 100 is configured to delay the high-frequency clock signal by different time intervals so that the outputs D1-D4 (i.e., the plurality of delayed high-frequency clock signals) are offset in time from one another as shown, for example, by waveforms D1-D4 in FIG. 2.

The plurality of delayed high-frequency clock signals are provided to a clocked register circuit 105. Each of the delayed high-frequency clock signals is used by the register circuit 105 as a clock signal to sample, at different times, an input signal provided to the register circuit 105. As shown in FIG. 2, the input signal is sampled by the register circuit 105 using each of the delayed high-frequency clock signals D1-D4 so that the value of the input signal is sampled at different times to provide delayed edge outputs Q1-Q4. In other words, because the edges of the delayed high-frequency clock signals D1-D4 are offset from one another, each of the delayed high-frequency clock signals samples the input signal at a different time as shown. Accordingly, it will be understood that the register circuit 105 can be configured with a plurality of cells each corresponding to one of the plurality of delayed high-frequency clock signals being used as a clock input thereto, and further, that the input signal is provided as data to each cell so that the delayed edge outputs Q1-Q4 reflect the values of the input signal to the cell after being sampled by the respective clock signal (D1-D4).

Still referring to FIG. 1, the register circuit 105 provides the plurality of clock delayed edge outputs Q1-Q4 corresponding to the values of the input signal sampled by the corresponding delayed high-frequency clock signals. The clock outputs Q1-Q4 are provided to a MUX circuit 110. The MUX circuit 110 selects one of the plurality of clock outputs Q1-Q4 responsive to selection signals provided by the selection circuit 115.

It will be understood that using the delayed edge outputs Q1-Q4 as the bases for the high-frequency spread-spectrum clock signal can help avoid some of the problems in the prior art, which may generate spread-spectrum clock signals using only delayed clock signals. In particular, the use of such prior art delayed clock only techniques in synchronous systems can lead to problems where the prior art delayed clock may actually miss a clock cycle, especially at relatively low frequencies. In contrast, in some embodiments according to the present invention, the use of the delayed clock edges in conjunction with the delayed clock signals can reduce EMI as well as increase the suitability of such clock systems for use in synchronous systems by reducing the likelihood of missed clock cycles.

Figure 3:
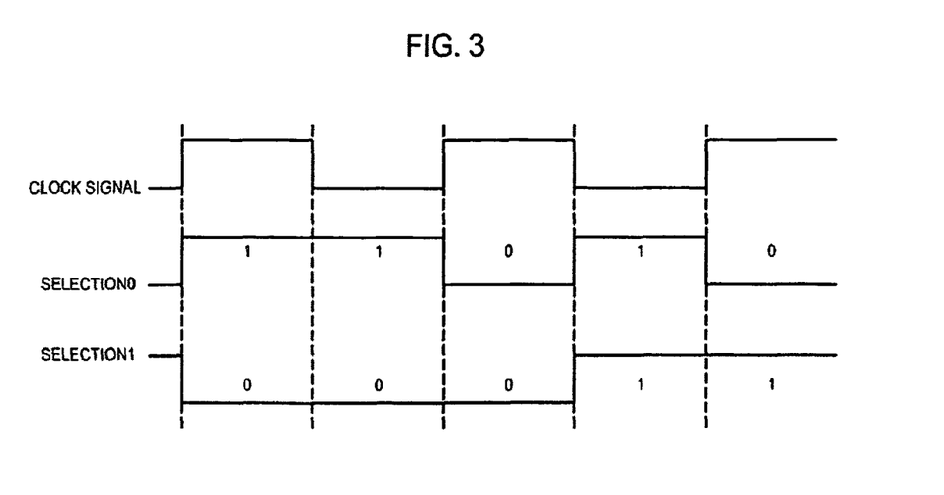

The selection circuit 115 provides the selection signals so that the MUX circuit 110 can change which of the clock outputs Q1-Q4 is selected as the spread-spectrum clock signal output therefrom as shown in FIG. 3. In particular, the selection circuit 115 can operate so that the MUX circuit 110 periodically changes which of the clock outputs Q1-Q4 is selected to provide the spread-spectrum clock signal. For example, as shown in FIG. 2, the selection circuit 115 may control the MUX circuit 110 so that clock output Q3 is first selected to provide the spread-spectrum clock signal. Accordingly, the clock edge labeled A in FIG. 2 may be the first clock edge appearing in the spread-spectrum clock signal provided by the MUX circuit 110. Next, the selection circuit 115 changes the selection signals provided to the MUX circuit 110 so that clock output Q4 is selected. Accordingly, clock edge B of clock output Q4 appears next in the spread-spectrum clock signal. Next, the selection circuit 115 changes the selection signals so that the MUX circuit 110 selects the clock output Q1 to provide the spread-spectrum clock signal. Accordingly, clock edge C of clock output Q1 is provided as the next clock edge of the spread-spectrum clock signal. Finally, the selection circuit 115 changes the selection signals so that the clock output Q2 is selected to provide the spread-spectrum clock signal. Accordingly, clock edge D of Q2 is selected as the next clock edge included in the spread-spectrum clock signal.

The selection circuit 115 may use a linear feedback shift register to provide a pseudo-random sequence of selection signals to the MUX circuit 110 so that the sequence in which the outputs Q1-Q4 are selected is according to a pseudo-random periodic order to increase the spreading of the clock edges used to provide the spread-spectrum clock signal in time, which may further reduce EMI.

In view of the above, the spread-spectrum signal can be generated so that the edges of the spread-spectrum clock signal can be shifted in time relative to other clock edges used by the synchronous system, which may spread the frequency content of the clock signals to reduce EMI.

Figure 4:
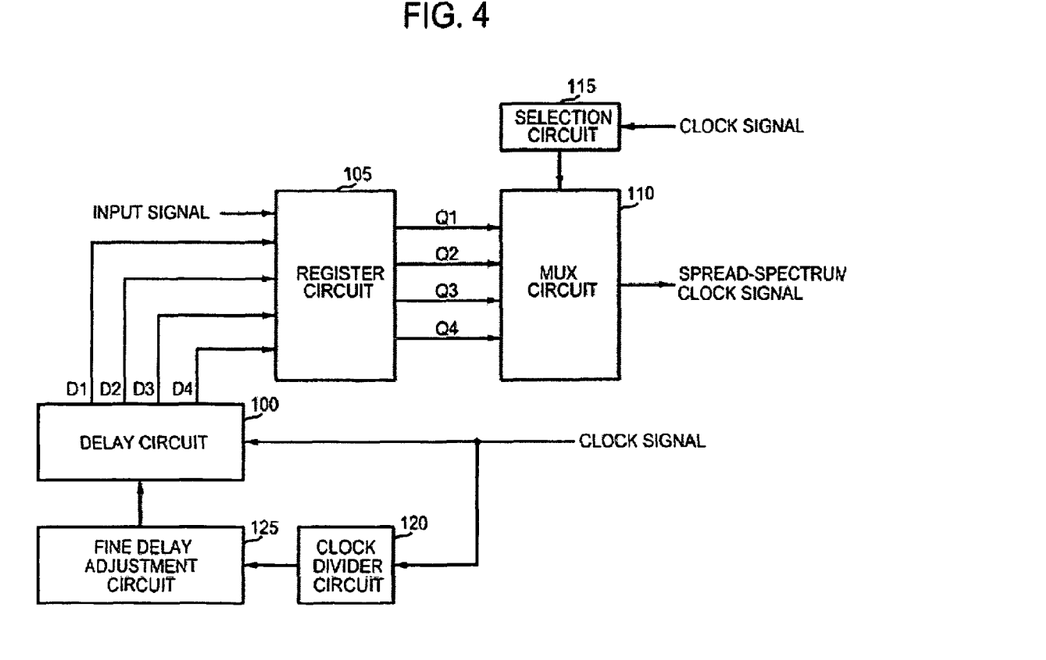
FIG. 4 is a block diagram that illustrates circuits and methods generating spread-spectrum clock signals using delay circuits according to some embodiments of the invention.

FIG. 4 is a block diagram that illustrates methods and circuits for providing a spread-spectrum clock signal according to some embodiments of the invention. As shown in FIG. 4, the high-frequency clock signal is provided to the delay circuit 100 as well as to the selection circuit 115 as described above. However, the high-frequency clock signal is also provided to a clock divider circuit 120 which divides the high-frequency clock signal so that the frequency thereof is lower than the high-frequency clock signal provided directly to the delay circuit 100 and the selection circuit 115. It will be understood that a period of the divided clock signal is, therefore, a multiple of the period of the high-frequency clock signal.

The divided clock signal provided by the clock divider circuit 120 is provided to a fine delay adjustment circuit 125. The fine delay adjustment circuit 125 provides selection signals to the delay circuit 100 which can change the time intervals used to delay the corresponding plurality of delayed high-frequency clock signals. In some embodiments according to the invention, the fine delay adjustment circuit 125 can change the selection signals provided to the delay circuit 100 on a random or pseudo-random basis. For example, in some embodiments according to the invention, the fine delay adjustment circuit 125 may use a linear feedback shift register to provide a pseudo-random sequence of selection signals to the delay circuit 100 so that the different time intervals used to delay the high-frequency clock signal are applied according to a pseudo-random periodic order to increase the spreading of the clock edges used to provide the spread-spectrum clock signal in time, which may further reduce EMI.

It will be understood that the clock divider circuit 120 can be any circuit which divides the high-frequency clock signal to provide a lower frequency clock signal to the fine delay adjustment circuit 125. For example, in some embodiments according to the invention, the clock divider circuit 120 is a clock divider, such as a toggle flip-flop circuit, that divides the high-frequency clock signal by 2 so that the clock signal provided to the fine delay adjustment circuit 125 is half the frequency of the high-frequency clock signal provided directly to the delay circuit 100 and to the selection circuit 115.

Moreover, the combination of changing selection signals provided by the selection circuit 115 and the changing selection signals provided by the fine delay adjustment circuit 125 can combine to allow a further reduction in EMI. In particular, the selection circuit 115 can modify the selection signals to the MUX circuit 110 so that the delayed high-frequency clock signals are pseudo-randomly selected to provide the respective clock edges for the spread-spectrum clock signal. Furthermore, the selection signals provided by the fine delay adjustment circuit 125 can pseudo-randomly change with time intervals used to provide the plurality of delayed high-frequency clock signals provided to the MUX circuit 110. Accordingly, the spread-spectrum clock signal can include both the pseudo-randomly modified time intervals used to generate the delayed high frequency clock signals as well as the pseudo-randomly selected clock edges provide to the MUX circuit 110 thereby further reducing EMI.

Figure 5:
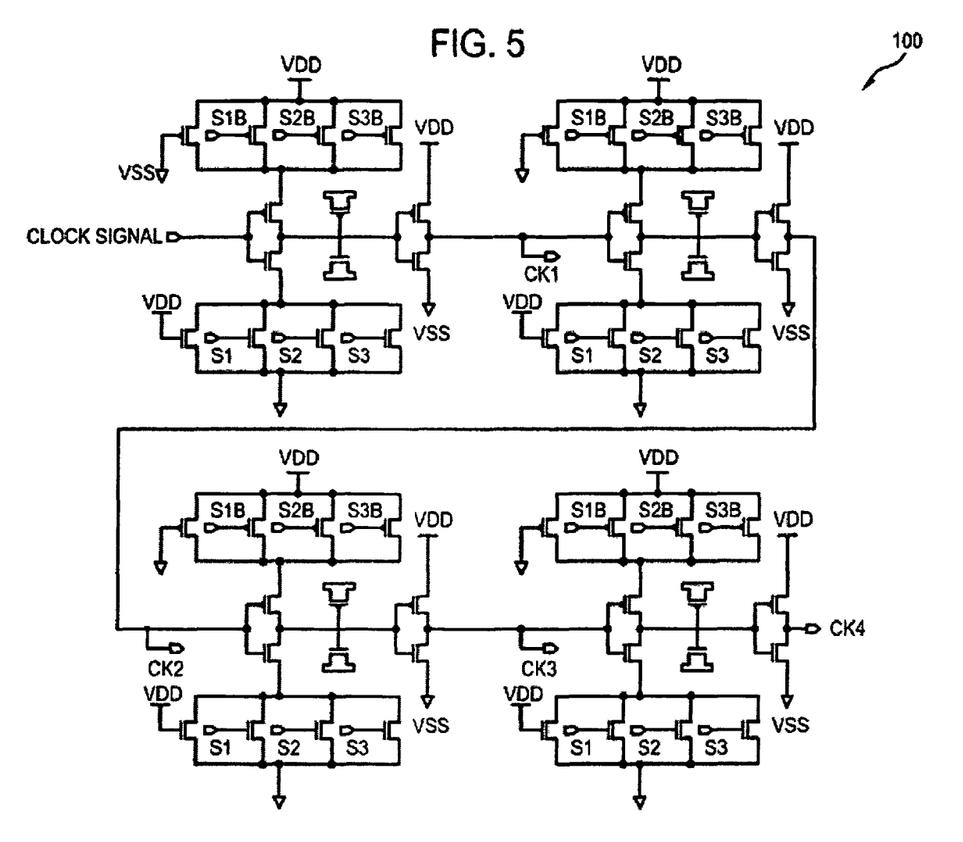
FIG. 5 is a schematic illustration of a delay circuit according to some embodiments of the invention.

FIG. 5 is a schematic illustration of a delay circuit 100 according to some embodiments of the invention. As shown in FIG. 5, delay circuit 100 can include non-sequential (i.e., non-clocked) logic having the high-frequency clock signal provided thereto. Furthermore, the selection signals S1-S3 and S1B-S3B can be provided to the pullup/pulldown transistors shown in FIG. 5. It will be understood that the pullup/pulldown transistors shown in FIG. 5 can each have different sizes so that the delay provided to each of the respective outputs of the delay circuit 100 (i.e., Ck1, Ck2, Ck3, and Ck4) can be different from one another because the sizes of the pullup/pulldown transistors associated with a particular output allows for different time delays to the outputs. For example, the pullup/pulldown transistors preceding output Ck1 can be sized so that the time interval between the input of the high-frequency clock signal and the output at Ck1 is shorter than the time interval from the arrival of the clock signal at the input to the output of the clock signal at the subsequent outputs Ck2-Ck4.

Similarly, the pullup/pulldown transistors associated with Ck2 can be sized so that the time interval from the input of the high-frequency signal to the output of Ck2 is greater than Ck1, but less than the intervals associated with Ck3 and Ck4. Furthermore, the pullup/pulldown transistors associated with the output Ck3 can be sized so that the time interval from the arrival of the high-frequency clock signal at the input to the output at Ck3 is greater than Ck2, but less than Ck4. Finally, the pullup/pulldown transistors associated with Ck4 can be sized so that the time interval from the arrival of the high-frequency clock signal at the input to the output at Ck4 is greater than each of the time intervals associated with output Ck1-Ck3.

Figure 6:
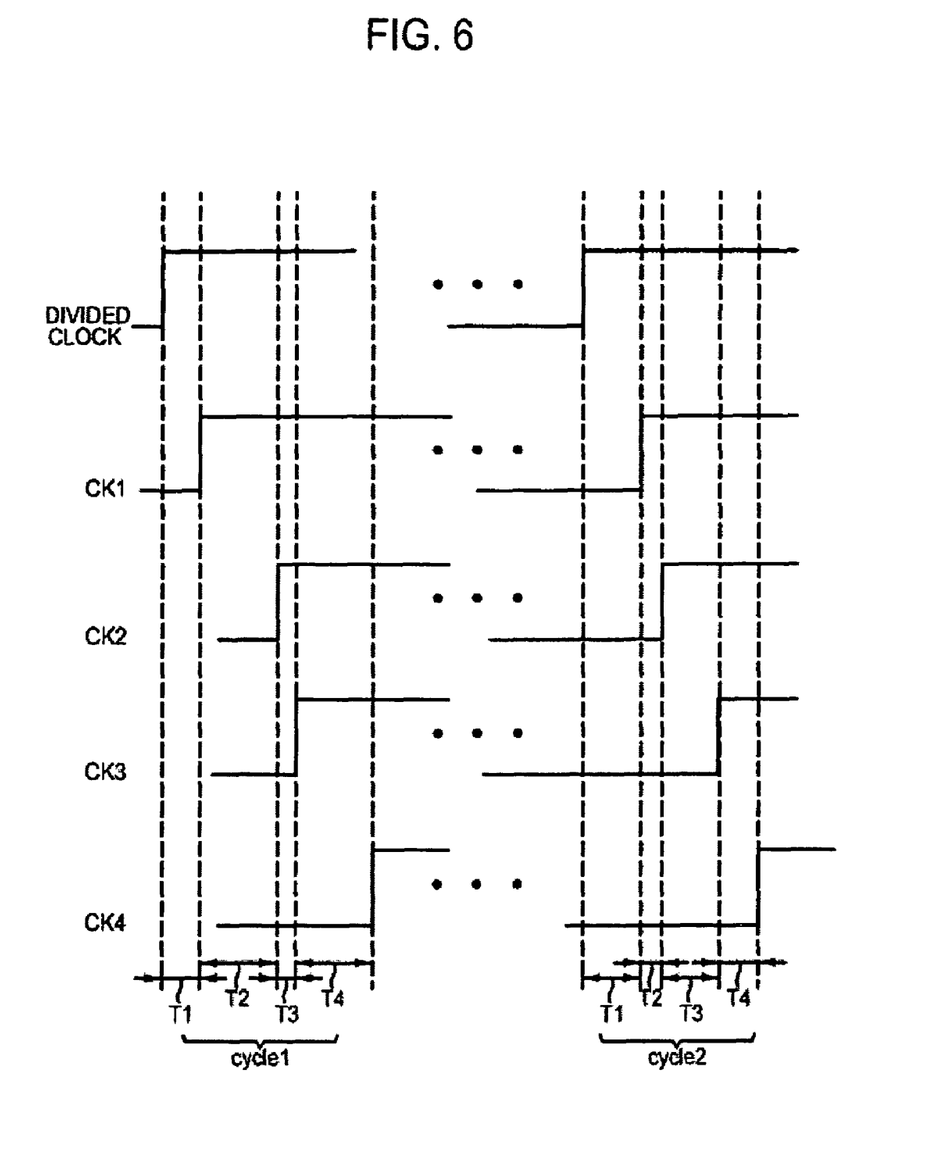
FIG. 6 is a timing diagram that illustrates operations of fine delay adjustment circuits according to some embodiments of the invention.

In operation, the delay circuit 100 shown in FIG. 5 can cause the time interval provided to each of the outputs of the delay circuit 100 to change responsive to the selection signals from the fine delay adjustment circuit 125. For example, as shown in FIG. 6, when the fine delay adjustment circuit 125 outputs selection signals S1-S3, the delay circuit 100 shown in FIG. 5 can turn on the pullup/pulldown transistors enabled by the combination of selection signals S1-S3/S1B-S3B. Accordingly, the delay circuit 100 delays the clock signal provided to the input a first time interval to output Ck1, a second time interval for output Ck2, a third time interval for output Ck3, and a fourth time interval for output Ck4.

However, when the selection signals provided by the fine delay adjustment circuit 125 are changed, the different selection signals enable different pullup/pulldown transistors associated with each of the outputs of the delay circuit 100 so that a different time interval for the output Ck1-Ck4 is used. In particular, the different combination of selection signals enables different combinations of pullup/pulldown transistors (each having different sizes relative to one another) so that the time interval for the respective output changes based on the selection signals as the inverter used to drive the pullup/pulldown transistors drives faster or slower depending on which of the pullup/pulldown transistors is enabled.

Accordingly, as illustrated in FIG. 6, the fine delay adjustment circuit 125 can provide the control signals S1-S3/S1B-S3B as described above to the delay circuit 100 (shown in FIG. 5) to fine tune the delay introduced to the edges of signals D1-D4 provided to the register circuit 105 during a first cycle 1. In particular, as shown in FIG. 6, the divided clock is delayed by the first stage of the delay circuit 100 based on the conditions of the selection signals S1-S3/S1B-S3B to introduce a delay (T1) to the clock edge CK1. Further, the second stage of the delay circuit 100 introduces a second delay T2 to CK1 which is different than T1, to provide CK2. The output of the second stage (CK2) is delayed by the third stage of the delay circuit 100 to include a third delay (T3) to provide the clock signal CK3. Further, the fourth stage of the delay circuit 100 introduces a fourth delay (T4) to provide the output CK4. As described above, the delays introduced by the respective stages of the delay circuit 100 can be different despite the fact that the selection signals provided to each of the stages are the same based on, for example, the different sizes of the transistors included in the pullup/pulldown circuits.

As further shown in FIG. 6, during a subsequent cycle (cycle 2) of the divided clock signal, delays are also introduced into the edges of the clock signals provided by the delay circuit 100. However, the delays T1-T4 that separate the adjacent clock edges from one another can be different than those shown in cycle 1 as the selection signals provided to the delay circuit 100 have changed between the first cycle and the second cycle of the divided clock signal. Therefore, FIG. 6 illustrates that in some embodiments according to the invention, the delays introduced into the clock edges of CK1-CK4 can be more finely varied randomly/pseudo-randomly to further reduce EMI.

Figure 7:
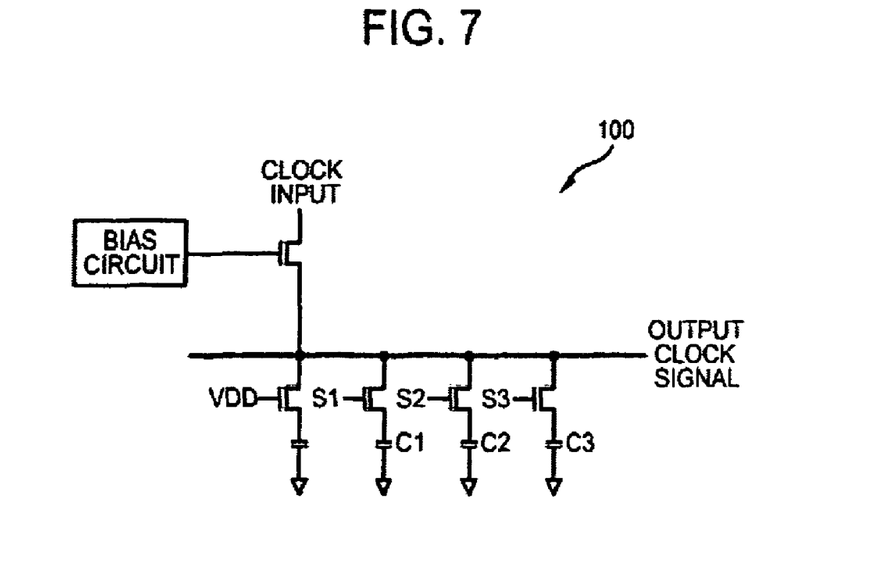
FIG. 7 is a schematic diagram that illustrates delay circuits according to some embodiments of the invention.

FIG. 7 is a schematic diagram that illustrates delay circuits 100 according to some embodiments of the invention. According to FIG. 7, bias transistors are coupled to the high frequency clock signal input along with a series of load transistors each having an associated capacitive load C1-C3 associated therewith. In operation, the selection signals S1-S3 can be provided to the gates of the load transistors having the capacitive load C1-C3 coupled thereto. As described above in reference to FIG. 6, the selection signals select which of the load transistors is to be enabled thereby providing different capacitive loads to the high frequency clock signal, which in-turn can provide a different time interval for the delay of the high frequency clock signal. It will be understood that although only one cell for a delay is shown in FIG. 7, additional cells may be used for each of the outputs of the delay circuit 100.

In operation, the bias transistor may provide for increased immunity to power supply variation as the bias transistor turns on less if the power supply voltage is relatively low so that the clock signal line is loaded with less capacitance due to the lowered turn on of the biased transistor. Alternatively, if the power supply voltage is relatively high, the bias transistor turns on more so that the high frequency clock signal is coupled to greater capacitance so that the time interval provided for the delay of the clock signal increases (i.e., the greater capacitance causes the high frequency clock signal to be delayed more). Accordingly, the delay circuit 100 shown in FIG. 7 may provide improved immunity to variation in power supply voltage by providing more uniform time intervals for delay of the high frequency clock signal despite power supply variations.

Figure 8:
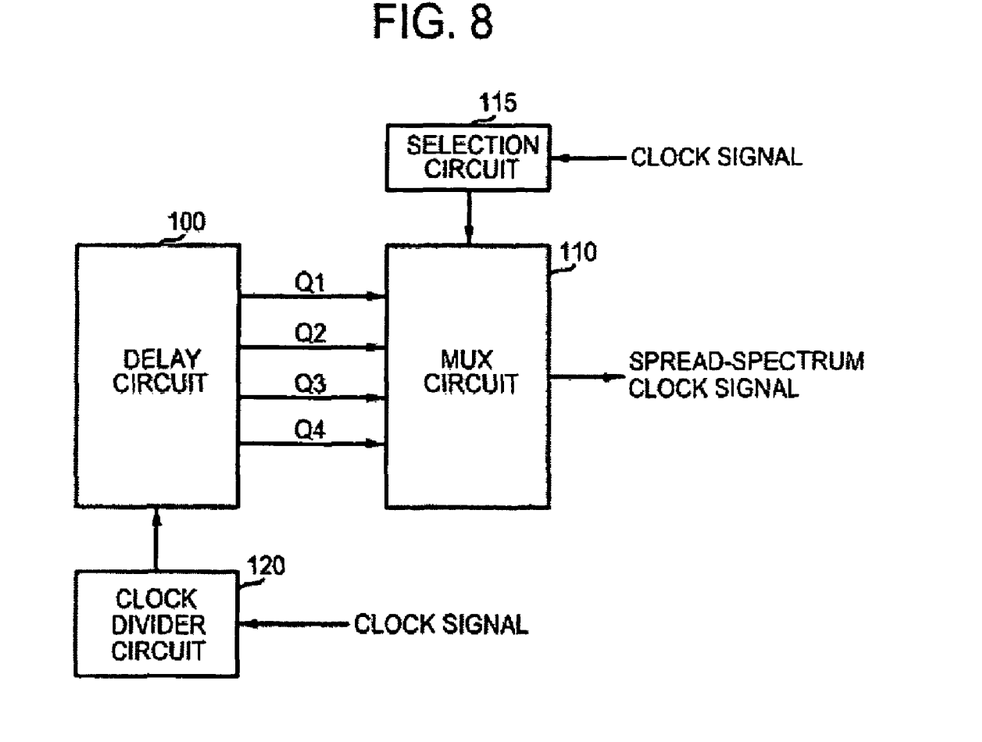
FIGS. 8 and 9 are block diagrams that illustrate circuits and methods for generating spread-spectrum clock signals using delay circuits according to some embodiments of the invention.

FIG. 8 is a block diagram that illustrates methods and circuits used to generate spread-spectrum clock signals according to some embodiments of the invention. As shown in FIG. 8, a high frequency clock signal is provided to the selection circuit 115 and the clock divider circuit 120. The clock divider circuit 120 divides the high frequency clock signal and provides the divided clock to the delay circuit 100. The delay circuit 100 delays the divided high frequency clock signal at different time intervals to provide a plurality of delayed high frequency clock signals each being delayed a respective different time interval. The plurality of delayed high frequency clock signals are provided to the MUX circuit 110 for selection by the selection circuit 115 responsive to the high frequency clock signal. In particular, the MUX circuit 110 can select (either randomly or pseudo-randomly) among the plurality of delayed high frequency clock signals to provide the spread-spectrum clock signal. Accordingly, the circuit shown in FIG. 8 can be used to provide the delayed high frequency clock signals to the MUX circuit 110 without an intervening clocked register circuit 105 as shown in FIG. 1.

Figure 9:
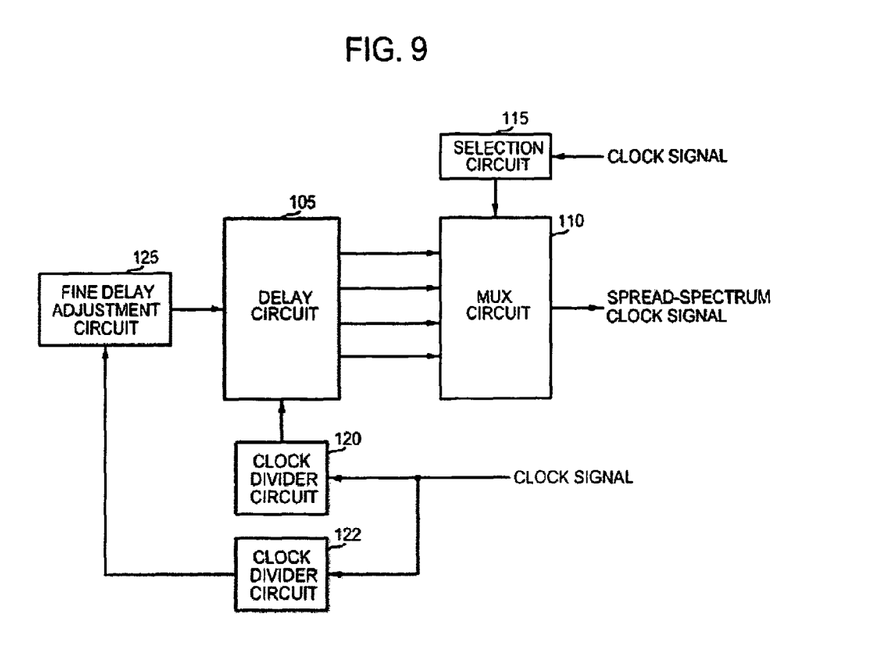

FIG. 9 is a block diagram that illustrates methods and circuits for generating spread-spectrum clock signals according to some embodiments of the invention. As shown in FIG. 9 a high frequency clock signal is provided to the selection circuit 115, the clock divider circuit 120 and a clock divider circuit 122. The clock divider circuit 122 divides the high frequency clock signal and provides the divided clock signal to the fine delay adjustment circuit 125.

The fine delay adjustment circuit 125 provides the selection signals to the delay circuit 100 according to a random or pseudo-random sequence as described above in reference to FIG. 4. Accordingly, the circuit shown in FIG. 9 can provide the plurality of delayed high frequency clock signals to the MUX circuit 110 for generation of the spread-spectrum clock signal by pseudo-randomly selecting clock edges for inclusion therein through a combination of selections by the selection circuit 115 and the fine delay adjustment circuit 125.

Figure 10:
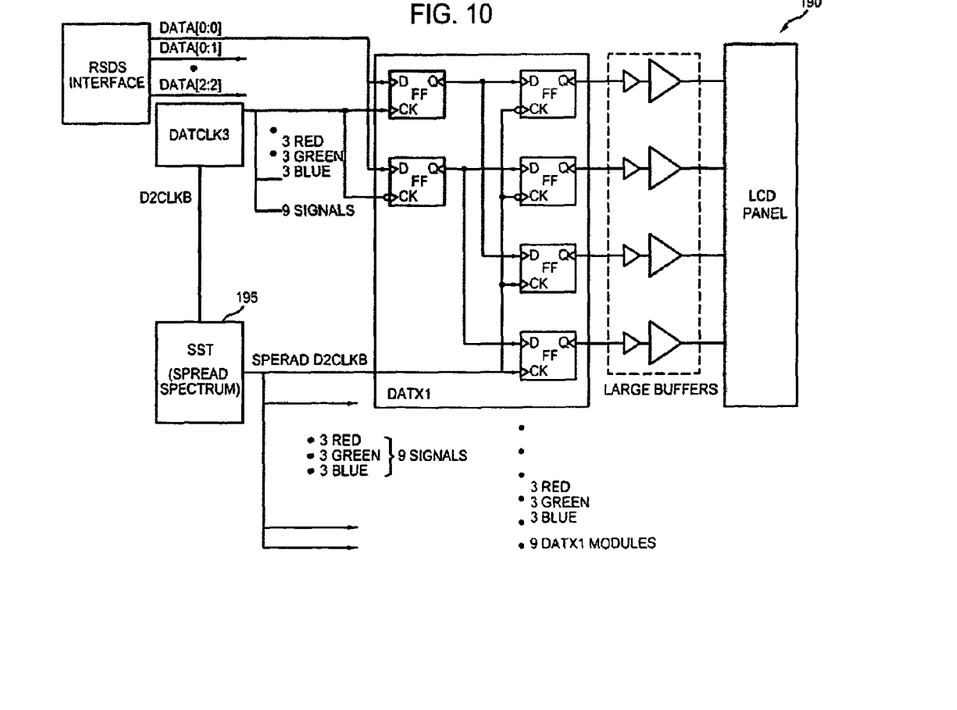
FIG. 10 is a block diagram illustrating a system utilizing circuits and methods of generating spread-spectrum clock signals according to some embodiments of the invention.

FIG. 10 is a block diagram illustrating a system 190 for driving an LCD panel including circuits for generating a spread-spectrum clock according to some embodiments of the invention. According to FIG. 10, a large amount of data is provided for driving to the LCD panel. The spread-spectrum clock circuit 195 generates the plurality of spread-spectrum clock signals for clocking of RGB data to the LCD panel, for example, data [0:0]. The spread-spectrum clock circuit 195 can generate each of the spread-spectrum clock signals for the clock circuits that provide each of the RGB data bits to the LCD panel using the pseudo-random selection of clock edges and/or the pseudo-random fine delay adjustment to further reduce EMI for the driver of the LCD panel.

Figure 11A:
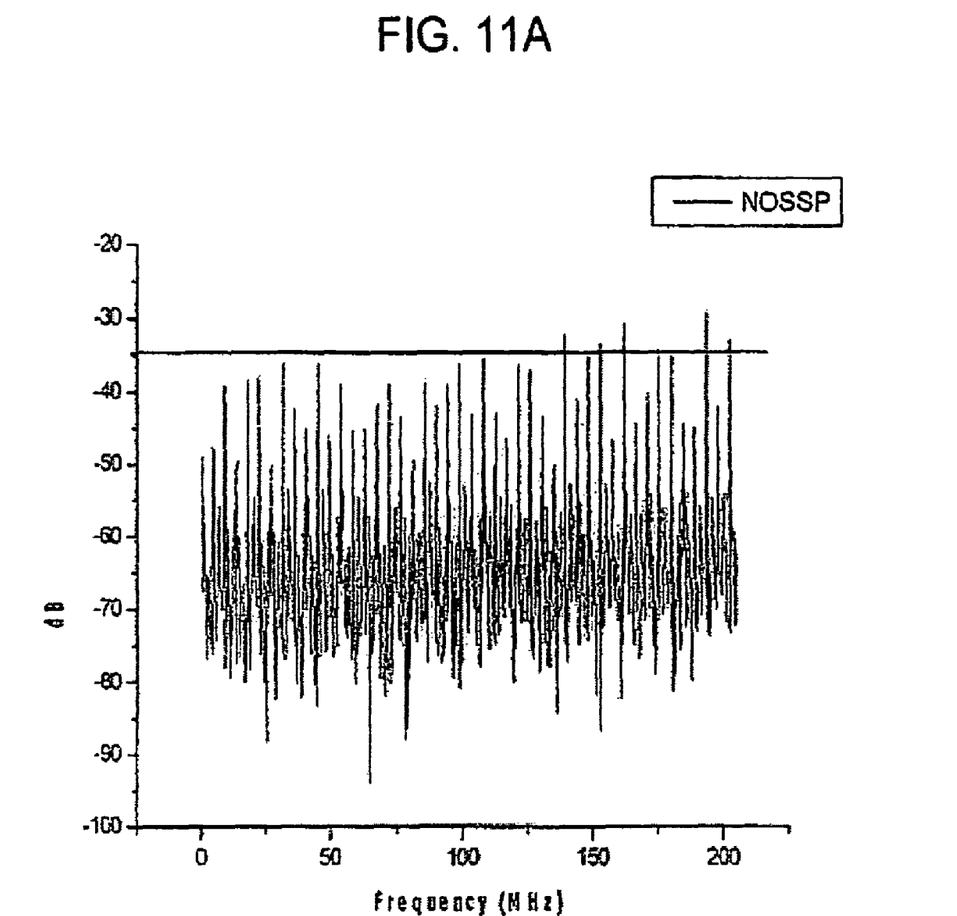
FIGS. 11A and 11B are graphs that illustrate experimental data reflecting the performance of conventional circuits and circuits according to some embodiments of the invention, respectively.
Figure 11B:
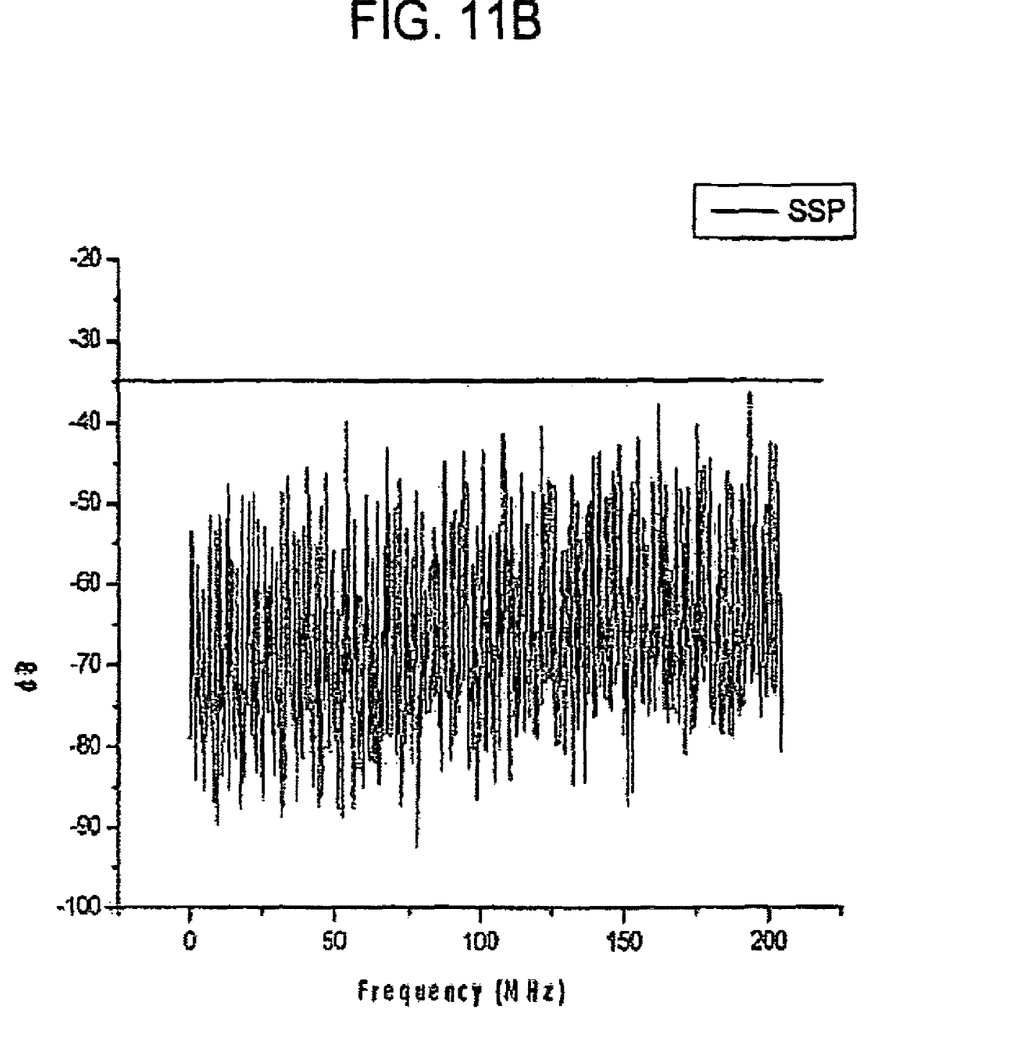

FIG. 11A is a graph showing EMI levels as a function of frequency for a conventional system. In contrast, FIG. 11B shows EMI levels as a function of frequency in a driver utilizing spread-spectrum clocking techniques according to some embodiments of the invention.

As described herein, embodiments according to the invention can provide circuits, methods, and systems for the generation of spread-spectrum clocks by delaying a high-frequency clock signal to provide a plurality of delayed high-frequency clock signals, which are selected among to provide the spread-spectrum clock signal. In some embodiments according to the invention, a plurality of delayed high-frequency clock signals are provided by delaying the high-frequency clock signal which is used for the overall synchronous operation of the system. Delaying the high-frequency clock signal provides a plurality of delayed high-frequency clock signals which can be selected among to provide the spread-spectrum clock signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A spread-spectrum clock signal generator circuit comprising:
a delay circuit configured to receive a clock signal and provide a plurality of delayed clock signals based thereon;
a pseudo-random clock selection signal generator configured to generate delayed clock selection signals responsive to the clock signal; and
a multiplexer circuit coupled to the pseudo-random clock selection signal generator and the delay circuit and configured to pseudo-randomly select among the plurality of delayed clock signals; and
a plurality of sequential devices coupled to the plurality of delayed clock signals and configured to sample an input signal at different time intervals responsive to the plurality of delayed clock signals to provide a sampled input signal to the multiplexer circuit, wherein the delay circuit comprises:
a plurality of inverter stages coupled in serial with one another and including respective outputs to provide a respective delayed clock signal output;
a plurality of pull-up loads coupled to respective inverter stages; and
a plurality of pull-down loads coupled to the respective inverter stages.

2. The circuit according to claim 1 further comprising:
a pseudo-random fine delay control signal generator coupled to the delay circuit, the delay circuit further configured to select among a plurality of fine delays for inclusion in the plurality of delayed clock signals.

3. The circuit according to claim 2 wherein the pseudo-random fine delay control signal generator provides pseudo-random fine delay control signals responsive a fine delay clock signal to pseudo-randomly provide one of a plurality of different time intervals for each of the plurality of delayed high frequency clock signals responsive to a multiple of fine delay clock signal cycles.

4. The circuit according to claim 3 further comprising:
a clock divider circuit coupled to the pseudo-random fine delay control signal generator and configured to provide the fine delay clock signal responsive to the clock signal.

5. The circuit according to claim 1 wherein the clock signal comprises a high frequency clock signal,
wherein the plurality of sequential devices is configured to sample a low frequency clock signal responsive to the plurality of delayed clock signals to provide a plurality of sampled delayed low frequency clock signals to the multiplexer circuit.

6. The circuit according to claim 1 further comprising:
a clock divider circuit coupled to the delay circuit and configured to divide a high frequency clock signal by about one half to provide the clock signal to the delay circuit.

7. The circuit according to claim 1 wherein the plurality of pull-up loads and the plurality of pull-down loads are coupled to fine delay control signals configured to pseudo-randomly select among respective ones of transistors to vary pull-up speed and pull-down speed of the plurality of inverters.

8. The circuit according to claim 1 wherein the delay circuit comprises:
a plurality of inverter stages coupled in serial with one another and including respective outputs to provide a respective delayed clock signal output;
a plurality of fine delay adjust circuits coupled to the outputs of the plurality of inverter stages, wherein the plurality of fine delay adjust circuits comprise:
a bias transistor coupled to a power supply bias voltage and a respective output of a respective one of the plurality of inverter stages; and
capacitive load select transistors coupled to different capacitive loads and one of the fine delay control signals, wherein the capacitive load select transistors are configured to provide selectable capacitive loads to the bias transistor responsive to the fine delay control signals.

9. The circuit according to claim 1 comprising a display driver integrated circuit.

* * * * *